United States Patent [19]

Fujita et al.

[11] Patent Number: 5,517,684
[45] Date of Patent: May 14, 1996

[54] RADIO COMMUNICATION SYSTEM HAVING CURRENT CONTROL CIRCUIT

[75] Inventors: Sinichi Fujita; Manuel L. Villa, Jr., both of Yokohama, Japan

[73] Assignee: Matsushita Electric Industrial Co., Ltd., Osaka, Japan

[21] Appl. No.: 376,456

[22] Filed: Jan. 23, 1995

Related U.S. Application Data

[63] Continuation of Ser. No. 990,243, Dec. 14, 1992, abandoned.

[30] Foreign Application Priority Data

Dec. 19, 1991 [JP] Japan ................... 3-336518

[51] Int. Cl.$^6$ .................................. H04B 1/16
[52] U.S. Cl. ..................... 455/234.2; 455/234.1; 455/250.1; 455/252.1; 330/278
[58] Field of Search ...................... 455/126, 127, 455/232.1, 234.1, 234.2, 235.1, 240.1, 254, 239.1, 241.1, 245.1, 255.2, 247.1, 249.1, 250.1, 251.1, 252.1, 333, 313; 330/278, 285, 254, 279, 296, 130, 136

[56] References Cited

U.S. PATENT DOCUMENTS

| | | | |
|---|---|---|---|
| 3,027,518 | 3/1962 | Ketchledge | 330/278 |
| 3,052,853 | 9/1962 | Smith | 330/130 |
| 3,173,099 | 3/1965 | Oias | 330/285 |
| 3,254,306 | 5/1966 | Carlson | 330/285 |
| 3,395,357 | 7/1968 | Ketchledge | 330/285 |
| 3,510,580 | 5/1970 | Okuno | 455/234.1 |
| 3,512,096 | 5/1970 | Nagata et al. | 330/285 |
| 4,063,175 | 12/1977 | Friedman | 455/234.1 |
| 4,718,119 | 1/1988 | Salzer et al. | 330/278 |
| 5,239,683 | 8/1993 | Usui | 455/254 |

FOREIGN PATENT DOCUMENTS

| | | |
|---|---|---|
| 63-126720 | 9/1988 | Japan . |
| 3-117935 | 5/1991 | Japan . |
| 1351711 | 5/1974 | United Kingdom . |
| 2219897 | 12/1989 | United Kingdom . |

*Primary Examiner*—Reinhard J. Eisenzopf
*Assistant Examiner*—Nguyen Vo
*Attorney, Agent, or Firm*—Spencer & Frank

[57] ABSTRACT

In a radio communication system, a predetermined bias voltage is applied to the base of a transistor in a high-frequency amplifier circuit immediately before the transistor makes its normal operation. When a high-frequency input signal is received under a weak electric field, a control circuit generates a control voltage Cc of a high level so that the high-frequency amplifier circuit can operate with its large amplification factor. This control voltage is supplied to the base of the transistor through a diode and a resistor in a current control circuit to be added to the predetermined bias voltage to increase the base current so that the high-frequency amplifier circuit operates with a large amplification factor. On the other hand, when the input signal is received under a strong electric field, the control circuit supplies a control voltage of a low level to the base of the transistor so that the high-frequency amplifier circuit operates with a small amplification factor.

4 Claims, 4 Drawing Sheets

RADIO COMMUNICATION SYSTEM HAVING CURRENT CONTROL CIRCUIT

This application is a Continuation of application Ser. No. 07/990,243, Filed Dec. 14, 1992, now abandoned.

BACKGROUND OF THE INVENTION

1. Field of the Invention

The present invention relates to a radio communication system, such as, a portable radio telephone system or a land mobile radio telephone system. More particularly, the present invention relates; to a current control circuit applied to each of a high-frequency amplifier circuit and a frequency converter circuit in a radio communication system for operating with low current consumption.

2. Description of the Related Art

FIG. 4 shows the basic structure of one form of a transistor amplifier circuit used in a prior art radio communication system. Referring to FIG. 4, the transistor amplifier circuit includes a transistor 2, bias setting resistors R4, R6, R8 and an emitter resistor R10.

In the transistor amplifier circuit having the structure shown in FIG. 4, the level of its power supply voltage Vcc is changed to control the collector current Ic of the transistor 2. Also, the resistance value of the emitter resistor R10 is changed to control the emitter current Ie of the transistor 2. By suitably changing the level of the power supply voltage Vcc and the resistance value of the emitter resistor R10, the current consumption of the transistor amplifier circuit can be determined.

However, the transistor amplifier circuit used in the prior art radio communication system is defective in that, when the collector current Ic or the emitter current Ie of the transistor 2 is directly controlled, the amplifier operating point tends to fluctuate, resulting in impedance mismatching.

Thus, in order to avoid the undesirable fluctuation of the operating point of the transistor amplifier circuit in the prior art radio communication system, a current control circuit having a complex structure and consuming a relatively large current is inevitably required.

SUMMARY OF THE INVENTION

With a view to obviate such a prior art defect, it is an object of the present invention to provide a current control circuit which can minimize the undesirable fluctuation of the amplifier operating point and can reduce the current consumption in spite of its simple structure.

An embodiment of the present invention which attains the above object comprises bias voltage applying means (a current control circuit) for applying a predetermined bias voltage to the base of a transistor in a signal processing circuit carrying out predetermined signal processing and control voltage supplying means (a control circuit) connected to the bias voltage applying means for supplying a control voltage of a high level to be added to the bias voltage to increase the base current supplied to the transistor or a control voltage of a low level to be added to the bias voltage to decrease the base current supplied to the transistor.

Therefore, according to the present invention, a control voltage input of a high level is added to the bias voltage to increase the base current supplied to the transistor in the signal processing circuit carrying out the predetermined signal processing, or a control voltage input of a low level is added to the bias voltage to decrease the base current supplied to the transistor in the signal processing circuit carrying out the predetermined signal processing. Because of the above arrangement, a plurality of simple circuit elements, for example, a plurality of passive elements only are required to form the current control circuit in the radio communication system according to the present invention, so that the structure of the current control circuit can be simplified. Further, the undesirable fluctuation of the amplifier operating point can be minimized by the function of the current control circuit controlling the very small base current supplied to the transistor, and the current consumption of the current control circuit can also be reduced.

DESCRIPTION OF THE PREFERRED EMBODIMENTS

A preferred embodiment of the radio communication system according to the present invention will now be described with reference to FIGS. 1, 2, and 3.

Figure 1:
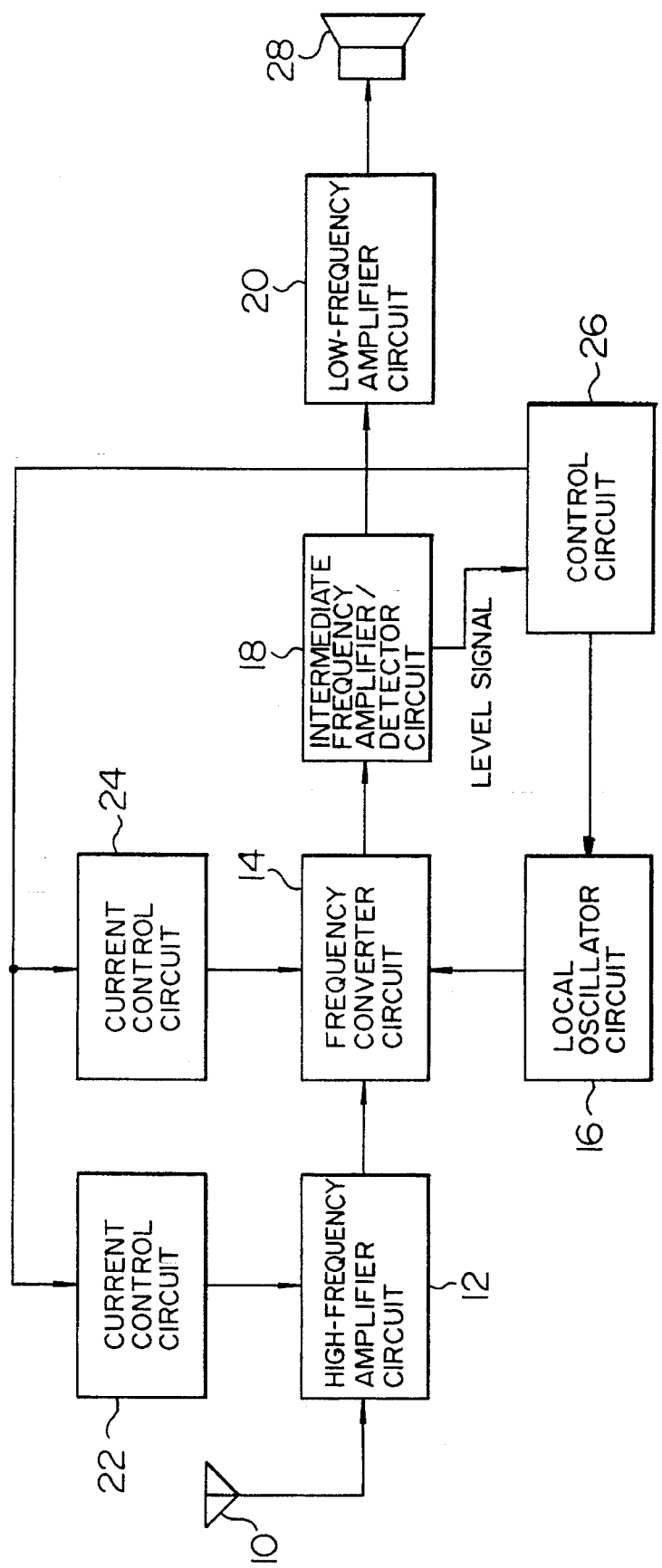
FIG. 1 is a block diagram of a signal receiver in an embodiment of the radio communication system of the present invention which comprises a first and a second current control circuit.

FIG. 1 shows the structure of the signal receiver of the radio communication system of the present invention which comprises two types of current control circuits. Referring to FIG. 1, the receiver of the radio communication system includes an antenna 10, a high-frequency amplifier circuit 12, a frequency converter circuit 14, a local oscillator circuit (a channel selection signal generator circuit) 16, an intermediate frequency amplifier/detector circuit 18, a low-frequency amplifier circuit 20, a first current control circuit 22 provided according to the present invention to control the bias current supplied to the high-frequency amplifier circuit 12, a second current control circuit 24 provided according to the present invention to control the bias current supplied to the frequency converter circuit 14, a control circuit 26 generating a control voltage Cc based on a level signal corresponding to an AGC signal applied from output the intermediate frequency amplifier/detector circuit 18 when a high-frequency signal is received under a weak or strong electric field strength, and a speaker 28.

Figure 2:
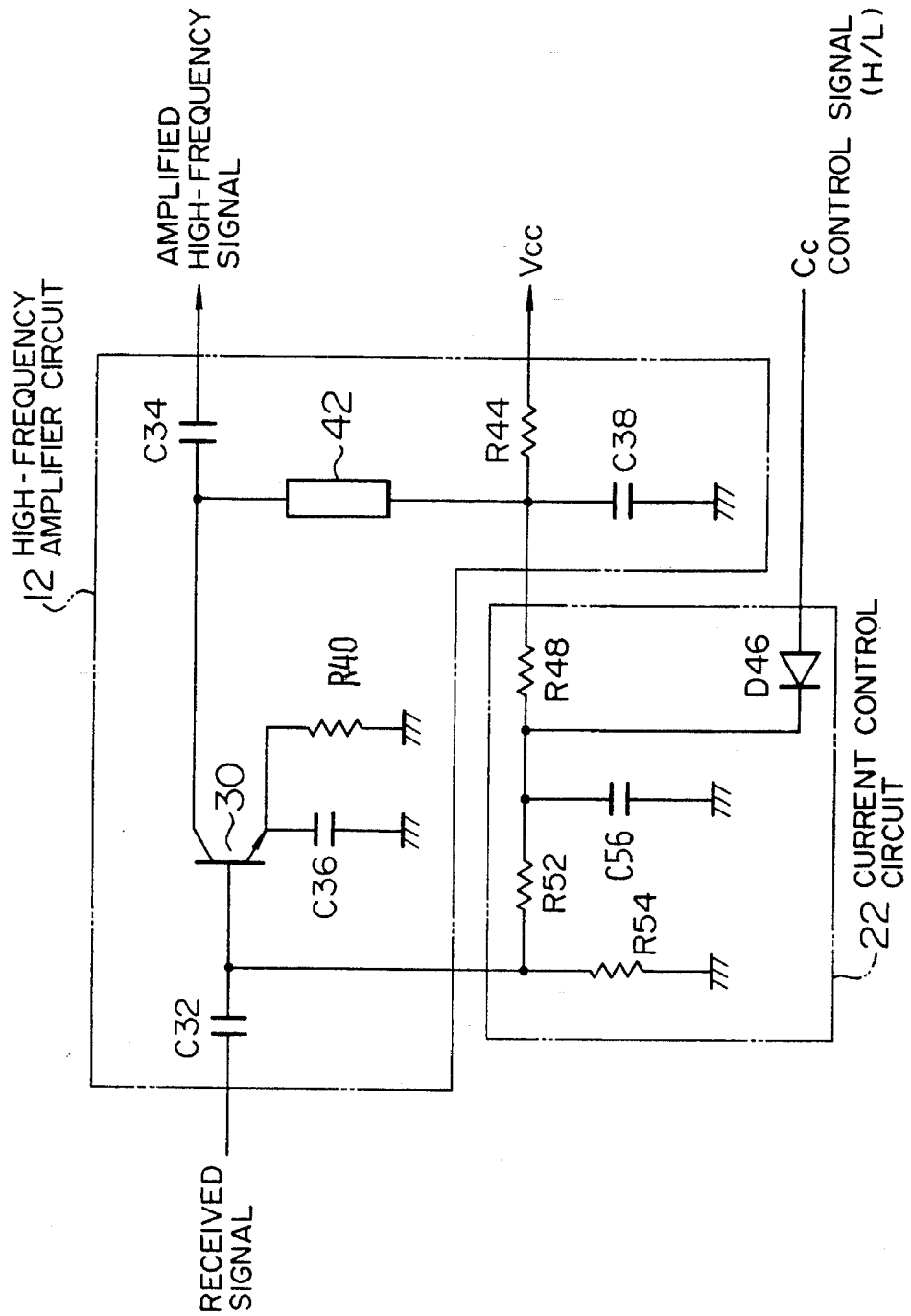
FIG. 2 is a circuit diagram of the first current control circuit applied or connected to the frequency amplifier circuit shown in FIG. 1.

FIG. 2 shows in detail the structure of the first current control circuit 22 applied according to the present invention to the high-frequency amplifier circuit 12 shown in FIG. 1. Referring to FIG. 2, the high-frequency amplifier circuit 12 includes a transistor 30, coupling capacitors C32 and C34, by-pass capacitors C36 and C38, an emitter resistor R40, a load 42, such as a tuning circuit, and a resistor R44 for applying a power supply voltage Vcc. The first current control circuit 22 includes a reverse voltage blocking diode D46 to which the control voltage Cc is supplied, a resistor R48 for applying the power supply voltage Vcc, a by-pass capacitor C56, and bias setting resistors R52 and R54 for the transistor 30.

The operation of the circuits 12 and 22 shown in FIG. 2 will now be described.

In response to the application of a high-frequency input signal, the transistor 30 amplifies the received signal to generate an amplified high-frequency signal as its output. Immediately before the transistor 30 makes its normal operation, a predetermined bias voltage is applied to the base of the transistor 30 by the combination of the Vcc applying resistor R48 and the bias setting resistors R52 and R54 in the current control circuit 22.

When the high-frequency input signal is received under a weak electric field, the level signal from the intermediate frequency amplifier/detector circuit 18 is supplied to the control circuit 26, and the control voltage Cc of a high (H) level appears from the control circuit 26. This high-level control voltage Cc is supplied to the base of the transistor 30 through the diode D46 and the resistor R52. This control voltage Cc is added to the predetermined bias voltage to increase the base current supplied to the transistor 30, so that the high-frequency amplifier circuit 12 operates with a large amplification factor. On the other hand, when the high-frequency input signal is received under a strong electric field, the level signal supplied from the intermediate frequency amplifier/detector circuit 18 to the control circuit 26 acts to operate the high-frequency amplifier circuit 12 with a small amplification factor, and the control voltage Cc of a low (L) level appears from the control circuit 26. This low-level control voltage Cc is supplied to the base of the transistor 30 through the diode D46 and the resistor R52. This control voltage is added to the predetermined bias voltage to increase the base current, so that the high-frequency amplifier circuit 12 operates now with a small amplification factor. When the control voltage Cc is at a low (L) level, the base current supplied to the transistor 30 is decreased as compared to that supplied when the control voltage Cc is at a high (H) level, so that the current consumption of the current control circuit 22 is reduced.

Thus, the simplified current control circuit 22 of the small size and the low cost composed of the simple plural passive elements can deal with a high-frequency input signal received under a weak electric field or a strong electric field, so that the amplification factor of the high-frequency amplifier circuit 12 can be suitably changed by controlling the very small base current supplied to the transistor 30. Thus, not only the current consumption of the current control circuit 22 can be reduced, but also undesirable fluctuation of the amplifier operating point can be minimized to facilitate the design of the current control circuit 22.

Figure 3:
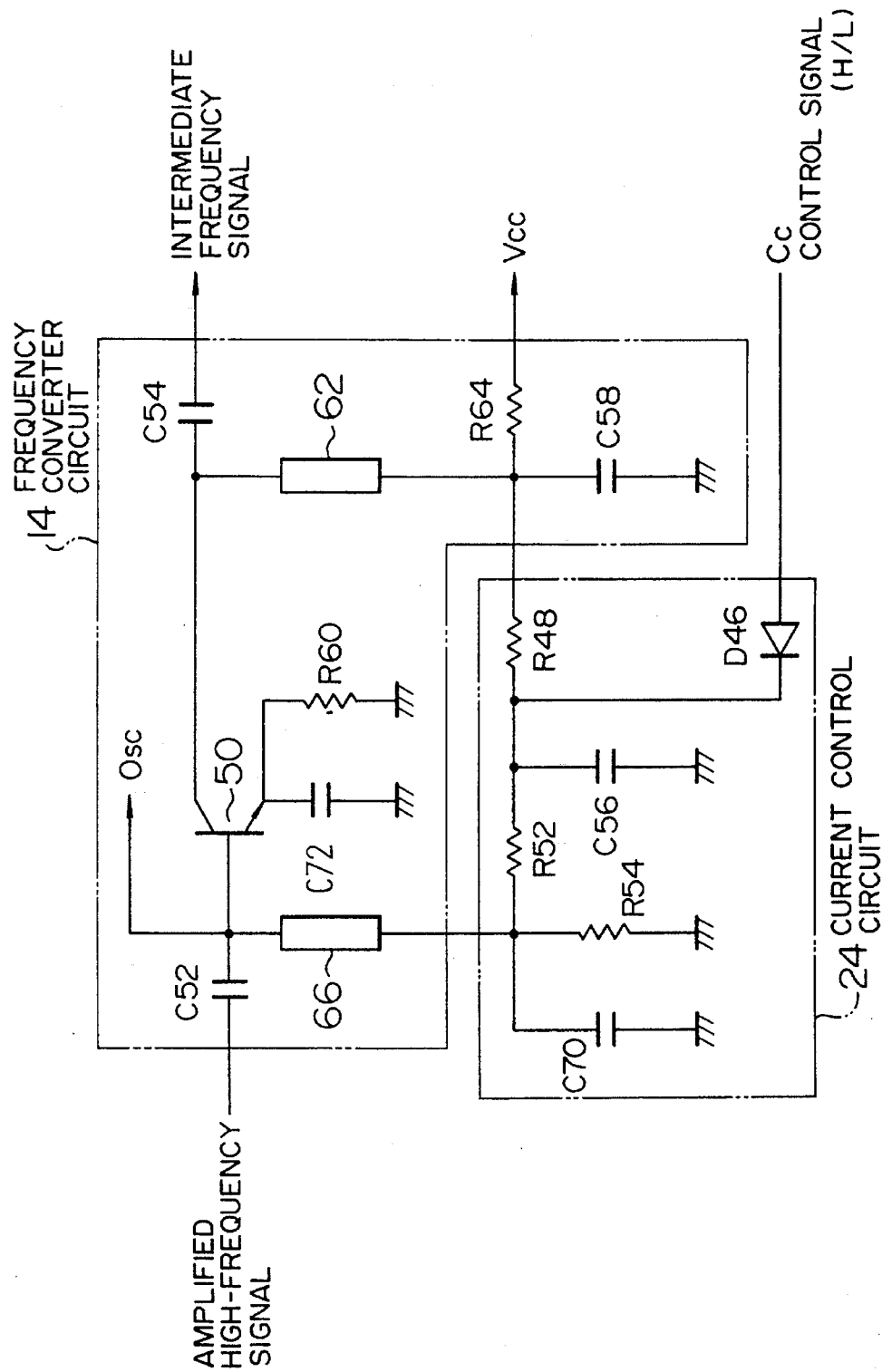
FIG. 3 is a circuit diagram of the second current control circuit applied or connected to the frequency converter circuit shown in FIG. 1.
Figure 4:
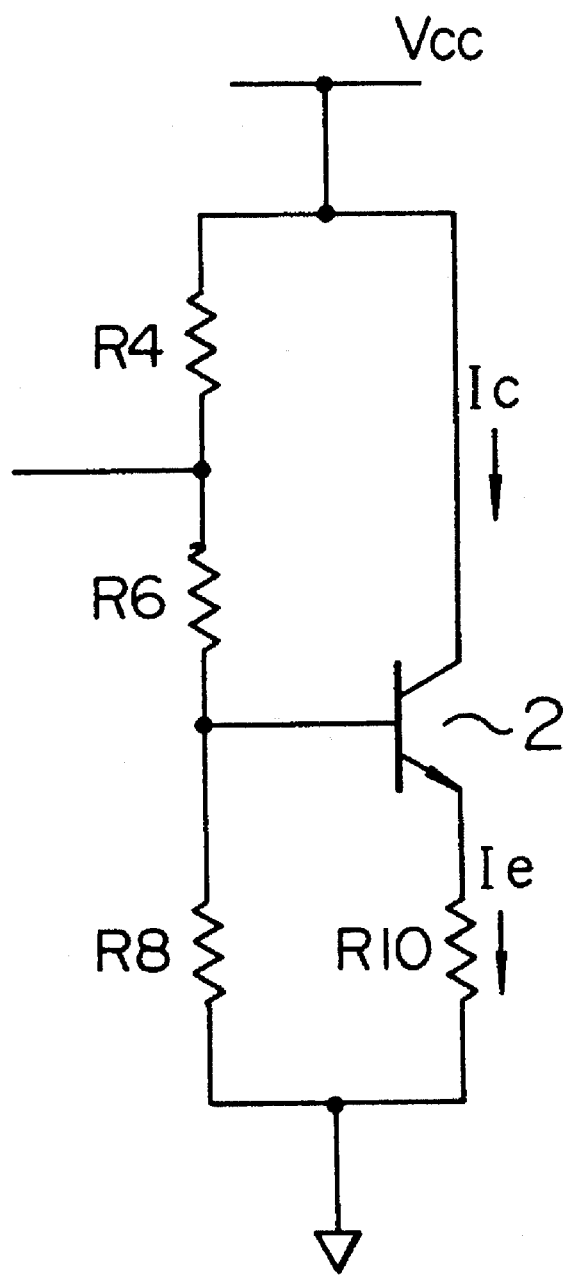
FIG. 4 is a circuit diagram showing one form of the basic structure of a transistor amplifier circuit used in a prior art radio communication system.

FIG. 3 shows in detail the structure of the second current control circuit 24 applied according to the present invention to the frequency converter circuit 14 shown in FIG. 1.

Referring to FIG. 3, the frequency converter circuit 14 includes a transistor 50, coupling capacitors C52 and C54, by-pass capacitors C72 and C58, an emitter resistor R60, a load 62, such as a tuning circuit, a resistor R64 for applying the power supply voltage Vcc, and an input matching circuit 66 for the load 62 which is, for example, the tuning circuit. The structure of the second current control circuit 24 is the same as that of the first current control circuit 22 shown in FIG. 2, except that a by-pass capacitor C70 is additionally connected in parallel to the resistor R54.

The operation of the circuits 14 and 24 shown in FIG. 3 will now be described. In the frequency converter circuit 14 shown in FIG. 3, the intermediate frequency signal is generated in response to the application of the amplified high-frequency signal and the local oscillation signal Osc to the transistor 50. In this case, the frequency converting operation of the transistor 50 is similar to that of the transistor 30 in the high-frequency amplifier circuit 12 shown in FIG. 2. The simplified current control circuit 24 shown in FIG. 3 can be similarly composed of a plurality of passive elements. Thus, the second current control circuit 24 has also a small size and can be made at a low cost. The second current control circuit 24 can suitably change the level of the amplified high-frequency signal supplied from the high-frequency amplifier circuit 12, and its current consumption can also be reduced.

It will be understood from the foregoing description that, in the radio communication system according to the present invention, a control voltage input of a high level is added to the bias voltage to increase the base current supplied to a transistor in a signal processing circuit carrying out a predetermined signal processing, or a control voltage input of a low level is added to the bias voltage to decrease the base current supplied to the transistor in the signal processing circuit carrying out the predetermined signal processing. Because of the above arrangement, a plurality of simple circuit elements, for example, a plurality of passive elements only are required to form a simplified current control circuit in the radio communication system according to the present invention. Further, undesirable fluctuation of the amplifier operating point can be minimized by the function of the current control circuit controlling the very small base current supplied to the transistor, and the current consumption of the current control circuit can also be reduced.

We claim:

1. A radio communication system including a high-frequency amplifier circuit and a frequency converter circuit connected to said high-frequency amplifier circuit, said radio communication system comprising:

a first current control circuit for applying a first predetermined bias voltage to a first transistor of said high-frequency amplifier circuit, the first transistor having a first terminal for an input, a second terminal coupled to a reference potential and a third terminal coupled to an output of the high-frequency amplifier circuit, the first predetermined bias voltage being applied to only the first terminal of the first transistor;

a second current control circuit for applying a second predetermined bias voltage to a second transistor of said frequency converter circuit, the second transistor having a first terminal for an input, a second terminal coupled to a reference potential and a third terminal coupled to an output of the frequency converter circuit, the second predetermined bias voltage being applied to only the first terminal of the second transistor; and a control circuit for supplying a control voltage to said first and second current control circuits which is added to said first and second bias voltages, respectively, the control voltage adding to the first predetermined bias voltage for reducing a current of the first terminal of the first transistor for a low amplification factor of the first transistor and for increasing the current of the first terminal of the first transistor for a high amplification factor of the first transistor, and adding to the second predetermined bias voltage for reducing a current of the first terminal of the second transistor for a low amplification factor of the second transistor and for increasing the current of the first terminal of the second transistor for a high amplification factor of the second transistor.

2. A radio communication system according to claim 1, wherein each of said first and second current control circuits includes a plurality of voltage-division resistors interconnected to provide said first and second predetermined bias voltages.

3. The radio communication system according to claim 2, wherein the voltage-division resistors of each of the first and second current control circuits includes a first resistor coupled between the control voltage and the first terminal of the transistor of each respective current control circuit and a second resistor coupled between the first terminal of the transistor of each respective current control circuit and the reference potential.

4. A radio communication system according to claim 1, wherein the first, second, and third terminals of said transistors are the base, emitter and collector terminals thereof, respectively.

* * * * *